(12) United States Patent
Park et al.

(10) Patent No.: US 7,984,364 B2
(45) Date of Patent: Jul. 19, 2011

(54) APPARATUS AND METHOD FOR TRANSMITTING/RECEIVING SIGNAL IN COMMUNICATION SYSTEM

(75) Inventors: Sung-Eun Park, Seoul (KR); Chi-Woo Lim, Suwon-si (KR); Dong-Seek Park, Yongin-si (KR); Jae-Yoel Kim, Suwon-si (KR); Seung-Hoon Choi, Suwon-si (KR); Gyu-Bum Kyung, Suwon-si (KR); Hong-Sil Jeong, Seoul (KR); Thierry Lestable, Middlesex (GB)

(73) Assignee: Samsung Electronics Co., Ltd (KR)

( * ) Notice: Subject to any disclaimer, the term of this patent is extended or adjusted under 35 U.S.C. 154(b) by 1111 days.

(21) Appl. No.: 11/800,035

(22) Filed: May 3, 2007

(65) Prior Publication Data

US 2007/0283219 A1 Dec. 6, 2007

(30) Foreign Application Priority Data

May 3, 2006 (KR) .......................... 10-2006-0040134

(51) Int. Cl.
*H03M 13/00* (2006.01)
(52) U.S. Cl. ........................................ 714/781; 714/758
(58) Field of Classification Search .................. 714/781, 714/758
See application file for complete search history.

(56) References Cited

U.S. PATENT DOCUMENTS

| | | | |
|---|---|---|---|
| 6,292,568 B1 | 9/2001 | Akins, III et al. | |
| 6,961,888 B2 | 11/2005 | Jin et al. | |
| 7,502,987 B2 * | 3/2009 | Kyung et al. | 714/781 |
| 7,516,391 B2 * | 4/2009 | Kyung et al. | 714/758 |
| 7,526,717 B2 * | 4/2009 | Kyung et al. | 714/800 |
| 7,600,174 B2 * | 10/2009 | Kyung et al. | 714/758 |
| 7,673,225 B2 * | 3/2010 | Jeong et al. | 714/800 |
| 7,747,929 B2 * | 6/2010 | Kyung et al. | 714/779 |
| 7,814,393 B2 * | 10/2010 | Kyung et al. | 714/758 |
| 2005/0149840 A1 | 7/2005 | Lee et al. | |
| 2006/0053359 A1 | 3/2006 | Chae et al. | |

FOREIGN PATENT DOCUMENTS

| | | |
|---|---|---|
| EP | 1 422 829 | 10/2003 |
| KR | 1020040044590 | 5/2004 |
| KR | 1020050063660 | 6/2005 |
| WO | WO 2005/011189 | 2/2005 |

OTHER PUBLICATIONS

"Digital Audio Broadcasting (DAB); Conditional Access", ETSI TS 102 367 V1.1.1, Jan. 2005.
"Digital Audio Broadcasting (DAB); Guidelines and Rules for Implementation and Operation; Part 1: System Outline", ETSI TR 101 496-1 V1.1.1, Nov. 2000.

* cited by examiner

*Primary Examiner* — Joseph D Torres
(74) *Attorney, Agent, or Firm* — The Farrell Law Firm, P.C.

(57) ABSTRACT

An apparatus and method for encoding/decoding a non-binary low density parity check (LDPC) code in a communication system. The apparatus and method includes receiving an information vector; generating a non-binary LDPC code by encoding the information vector into a non-binary LDPC code according to a non-binary LDPC encoding scheme.

56 Claims, 10 Drawing Sheets

$$TT = \begin{bmatrix} 0 & a & 0 & 0 & \cdots & 0 \\ 0 & 0 & 0 & b & \cdots & 0 \\ 0 & 0 & c & 0 & \cdots & 0 \\ \vdots & \vdots & \vdots & \vdots & \ddots & \vdots \\ 0 & 0 & 0 & 0 & \cdots & d \\ e & 0 & 0 & 0 & \cdots & 0 \end{bmatrix}$$

FIG.3

| $\Pi_{11}$ | $\Pi_{12}$ | 0 | $\Pi_{14}$ | ... | $\Pi_{1(n-m)}$ | $\Pi_{1(n-m+1)}$ | $\Pi_{1(n-m+2)}$ | 0 | 0 | 0 | 0 |
|---|---|---|---|---|---|---|---|---|---|---|---|
| $\Pi_{21}$ | 0 | $\Pi_{23}$ | $\Pi_{24}$ | ... | 0 | ... | $\Pi_{2(n-m+2)}$ | $\Pi_{2(n-m+3)}$ | 0 | 0 | 0 |
| 0 | $\Pi_{32}$ | $\Pi_{33}$ | 0 | ... | $\Pi_{3(n-m)}$ | $\Pi_{y(n-m+1)}$ | 0 | ... | ... | 0 | 0 |
| ... | ... | ... | ... | ... | ... | ... | ... | ... | ... | $\Pi_{(m-1)n}$ | 0 |
| $\Pi_{m1}$ | $\Pi_{m2}$ | 0 | $\Pi_{m4}$ | ... | $\Pi_{m(m-n)}$ | $\Pi_{m(n-m+1)}$ | 0 | 0 | ... | 0 | $\Pi_{mn}$ |

INFORMATION PART / PARITY PART

FIG.4

| INFORMATION PART | | | | | PARITY PART | | | | |
|---|---|---|---|---|---|---|---|---|---|
| $\alpha^{a_{11}}P^{b_{11}}$ | $\alpha^{a_{12}}P^{b_{12}}$ | 0 | $\alpha^{a_{14}}P^{b_{14}}$ | ... | $\alpha^{a_{1n-m}}P^{b_{1n-m}}$ | $\alpha^{j_1}P^{i_1}$ | $\alpha^{k_1}I$ | 0 | 0 | 0 |
| 0 | $\alpha^{a_{21}}P^{b_{21}}$ | $\alpha^{a_{23}}P^{b_{23}}$ | $\alpha^{a_{24}}P^{b_{24}}$ | ... | 0 | : | $\alpha^{i_2}P^{i_2}$ | $\alpha^{k_2}I$ | 0 | 0 |
| $\alpha^{a_{32}}P^{b_{32}}$ | 0 | $\alpha^{a_{33}}P^{b_{33}}$ | 0 | ... | $\alpha^{a_{3n-m}}P^{b_{3n-m}}$ | $\alpha^{j_y}P^{i_y}$ | 0 | $\alpha^{j_3}P^{i_3}$ | $a^{k_3}I$ | 0 |
| ... | ... | ... | ... | ... | ... | ... | ... | ... | ... |
| $\alpha^{a_{m1}}P^{b_{m1}}$ | $\alpha^{a_{m2}}P^{b_{m2}}$ | 0 | $\alpha^{a_{m4}}P^{b_{m4}}$ | ... | $\alpha^{a_{mn-m}}P^{b_{mn-m}}$ | $\alpha^{j_x}P^{i_x}$ | 0 | 0 | 0 | $\alpha^{j_{m-1}}P^{i_{m-1}}I$ |

FIG.6

$$B^T = \begin{array}{|c|c|c|c|c|c|c|c|} \hline \overset{1}{\alpha^{j_1}P^{i_1}} & 0 & \cdots & 0 & \overset{w}{\alpha^{j_y}P^{i_y}} & 0 & \cdots & \overset{m-1}{0} \\ \hline \end{array}$$

$$E = \begin{array}{|c|c|c|c|c|c|c|c|} \hline 0 & 0 & 0 & \cdots & 0 & 0 & 0 & \alpha^{j_m}P^{i_m} \\ \hline \end{array}$$

$$D = \begin{array}{|c|} \hline \alpha^{j_x}P^{i_x} \\ \hline \end{array}$$

$$T = \begin{array}{|c|c|c|c|c|c|c|c|} \hline \alpha^{k_1}I & 0 & 0 & 0 & \cdots & 0 & 0 & 0 \\ \hline \alpha^{j_2}P^{i_2} & \alpha^{k_2}I & 0 & 0 & \cdots & 0 & 0 & 0 \\ \hline 0 & \alpha^{j_3}P^{i_3} & \alpha^{k_3}I & 0 & \cdots & 0 & 0 & 0 \\ \hline 0 & 0 & \alpha^{j_4}P^{i_4} & \alpha^{k_4}I & \cdots & 0 & 0 & 0 \\ \hline \vdots & \vdots & \vdots & \ddots & \ddots & \vdots & \vdots & \vdots \\ \hline 0 & 0 & 0 & \cdots & \alpha^{j_{m-3}}P^{i_{m-3}} & \alpha^{k_{m-3}}I & 0 & 0 \\ \hline 0 & 0 & 0 & \cdots & 0 & \alpha^{j_{m-2}}P^{i_{m-2}} & \alpha^{k_{m-2}}I & 0 \\ \hline 0 & 0 & 0 & \cdots & 0 & 0 & \alpha^{j_{m-1}}P^{i_{m-1}} & \alpha^{k_{m-1}}I \\ \hline \end{array}$$

FIG.8A $$T^{-1} =$$

|   | 1 | 2 | 3 | ... | w | ... | t | ... | m-1 |
|---|---|---|---|---|---|---|---|---|---|
| 1 | $\alpha^{-k_1} I$ | 0 | 0 | ... | 0 | | 0 | ... | 0 |
| 2 | $\alpha^{j_2 k_1 k_2} P^{i_2}$ | $\alpha^{-k_2} I$ | 0 | ... | 0 | | 0 | ... | 0 |
| 3 | $\alpha^{j_2+j_3 k_1 k_2 k_3} \cdot P^{i_2+i_3}$ | $\alpha^{j_3 k_2 k_3} P^{i_3}$ | $\alpha^{-k_3} I$ | ⋱ | 0 | | 0 | ... | 0 |
| ⋮ | ⋮ | ⋮ | ⋮ | ⋱ | | | | | ⋮ |
| s | | | | | | | ▨ | ⋱ | 0 |
| ⋮ | | | | | | | | | |
| m-1 | ▨ | | ... | | ▨ | | | ... | $\alpha^{-k_{m-1}} I$ |

$$\alpha^{\sum_{r=2}^{m-1} j_r - \sum_{l=1}^{m-1} k_l} P^{\sum_{r=2}^{m-1} i_r} \qquad \alpha^{\sum_{r=w+1}^{m-1} j_r - \sum_{l=w}^{m-1} k_l} P^{\sum_{r=w+1}^{m-1} i_r} \qquad \alpha^{\sum_{r=t+1}^{s} j_r - \sum_{l=t}^{s} k_l} P^{\sum_{r=t+1}^{s} i_r}$$

FIG.8B

APPARATUS AND METHOD FOR TRANSMITTING/RECEIVING SIGNAL IN COMMUNICATION SYSTEM

PRIORITY

This application claims priority under 35 U.S.C. §119(a) to an application filed in the Korean Industrial Property Office on May 3, 2006 and assigned Ser. No. 2006-40134, the contents of which are incorporated herein by reference.

BACKGROUND OF THE INVENTION

1. Field of the Invention

The present invention generally relates to an apparatus and a method for transmitting/receiving signal in a communication system, and in particular, to an apparatus and a method for transmitting/receiving signal in a communication system using a non-binary Low Density Parity Check (LDPC) code.

2. Description of the Related Art

Next-generation communication systems have evolved from a packet service communication system for transmitting burst packet data to a plurality of Mobile Stations (MSs), with the packet service communication system being suitable for mass data transmission. Further, next-generation communication systems are considering an LDPC code, together with a turbo code, as a channel code. The LDPC code is known to have an excellent performance gain at high-speed data transmission, and advantageously enhances data transmission reliability by effectively correcting an error due to noise occurring in a transmission channel. Examples of next-generation communication systems considering the use of the LDPC code include the Institute of Electrical and Electronics Engineers (IEEE) 802.16e communication system, the IEEE 802.1n communication system, etc.

Reference will now be made to a signal transmission apparatus in a common communication system using an LDPC code.

Referring to FIG. 1, a conventional signal transmission apparatus includes an encoder 111, a modulator 113 and a transmitter 115. If an information vector s to be transmitted occurs in the signal transmission apparatus, the information vector s is delivered to the encoder 111. The encoder 111 generates a codeword vector c, that is, an LDPC codeword by encoding the information vector s in an encoding scheme, and then outputs the generated codeword vector c to the modulator 113. The encoding scheme corresponds to an LDPC encoding scheme. The modulator 113 generates a modulation vector m by modulating the codeword vector c in a modulation scheme, and then outputs the generated modulation vector m to the transmitter 115. The transmitter 115 inputs therein the modulation vector m output from the modulator 113, executes transmission signal processing for the input modulation vector m, and then transmits the processed modulation vector m to a signal reception apparatus through an antenna.

Now, reference will be made to a signal reception apparatus in a common communication system using an LDPC code.

Referring to FIG. 2, a conventional signal reception apparatus includes a receiver 211, a demodulator 213 and a decoder 215. A signal transmitted by a signal transmission apparatus is received through an antenna of the signal reception apparatus, and the received signal is delivered to the receiver 211. The receiver 211 executes reception signal processing for the received signal to thereby generate a reception vector r, and then outputs the processed and generated reception vector r to the demodulator 213. The demodulator 213 inputs therein the reception vector r output from the receiver 211, generates a demodulation vector x by demodulating the input reception vector r in a demodulation scheme corresponding to a modulation scheme applied to a modulator of the signal transmission apparatus, that is, the modulator 113, and then outputs the generated demodulation vector x to the decoder 215. The decoder 215 inputs therein the demodulation vector x output from the demodulator 213, decodes the input demodulation vector x in a decoding scheme corresponding to an encoding scheme applied to an encoder of the signal transmission apparatus, that is, the encoder 111, and then outputs the decoded demodulation vector x into a finally restored information vector $\hat{s}$. The decoding scheme, that is, an LDPC scheme, is a scheme using an iterative decoding process based on a sum-product process.

Meanwhile, a binary LDPC code is a code defined by a parity check matrix in which most elements have a value of 0, but a small minority of other elements have a non-zero value, for example, a value of 1. So, all elements of the parity check matrix of the binary LDPC code have one of a value of 0 or a non-zero value.

On the other hand, all elements of a parity check matrix of the non-binary LDPC code are elements on Galois Field (GF)(q). Here, "q" in GF(q) indicates the order of a GF, and $q=2^p$. Thus, the non-binary LDPC code is a code defined by a parity check matrix in which most elements have a value of 0, but a small minority: of other elements are non-zero elements, for example, elements on GF(q).

Using a non-binary LDPC code has only been considered in the conventional art, but there is provided no specific solution has been provided, for example, for generating a parity check matrix of a non-binary LDPC code and encoding/decoding the non-binary LDPC code, and for transmitting/receiving a signal using the non-binary LDPC code. Accordingly, there is a need for such a solution to transmit/receive a signal using a non-binary LDPC code.

SUMMARY OF THE INVENTION

The present invention addressees at least the above-mentioned problems occurring in the prior art, and provides an apparatus and a method for transmitting/receiving signal in a communication system using a non-binary LDPC code.

The present invention also provides a method for generating a parity check matrix in a communication system using a non-binary LDPC code.

In accordance with an aspect of the present invention, there is provided an apparatus for receiving signal in a communication system. The apparatus includes a receiver for receiving signal; and a decoder for generating an information vector by decoding the received signal using a parity check matrix of a non-binary LDPC code, wherein the parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, non-binary essential matrixes are arranged in blocks from among the blocks classified as the first parity part, the non-binary essential matrixes are arranged in blocks from among the blocks classified as the second parity part in a lower triangular form block by block, and a non-binary essential matrix is generated by multiplexing an element on Galois Field (GF)($q=2^p$) with a permutation matrix, where q is an order of the GF and p is an exponential numeral.

In accordance with another aspect of the present invention, there is provided an apparatus for transmitting signal in a communication system. The apparatus includes an encoder for generating a codeword vector by encoding an information vector using a parity check matrix of a non-binary LDPC code; and a transmitter for transmitting the codeword vector, wherein the parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, non-binary essential matrixes are arranged in blocks from among the blocks classified as the first parity part, the non-binary essential matrixes are arranged in blocks from among the blocks classified as the second parity part in a lower triangular form block by block, and a non-binary essential matrix is generated by multiplexing an element on Galois Field $(GF)(q=2^p)$ with a permutation matrix, where q is an order of the GF and p is an exponential numeral.

In accordance with still another aspect of the present invention, there is provided a method for generating a parity check matrix of a non-binary LDPC code in a communication system. The method includes generating a parity check matrix with a size corresponding to a coding rate and a codeword vector length used for coding an information vector as the LDPC code, wherein the parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, non-binary essential matrixes are arranged in blocks from among the blocks classified as the first parity part, the non-binary essential matrixes are arranged in blocks from among the blocks classified as the second parity part in a lower triangular form block by block, and a non-binary essential matrix is generated by multiplexing an element on Galois Field $(GF)(q=2^p)$ with a permutation matrix, where q is an order of the GF and p is an exponential numeral.

In accordance with yet another aspect of the present invention, there is provided a method for receiving signal in a signal reception apparatus of a communication system. The method includes receiving signal; and generating an information vector by decoding the received signal using a parity check matrix of a non-binary LDPC code, wherein the parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, non-binary essential matrixes are arranged in blocks from among the blocks classified as the first parity part, the non-binary essential matrixes are arranged in blocks from among the blocks classified as the second parity part in a lower triangular form block by block, and a non-binary essential matrix is generated by multiplexing an element on Galois Field $(GF)(q=2^p)$ with a permutation matrix, where q is an order of the GF and p is an exponential numeral.

In accordance with still a further aspect of the present invention, there is provided a method for transmitting signal in a signal transmission apparatus of a communication system. The method includes generating a codeword vector by encoding an information vector using a parity check matrix of a non-binary LDPC code; and transmitting the codeword vector, wherein the parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, non-binary essential matrixes are arranged in blocks from among the blocks classified as the first parity part, the non-binary essential matrixes are arranged in blocks from among the blocks classified as the second parity part in a lower triangular form block by block, and a non-binary essential matrix is generated by multiplexing an element on Galois Field $(GF)(q=2^p)$ with a permutation matrix, where q is an order of the GF and p is an exponential numeral.

In accordance with yet another aspect of the present invention, there is provided an apparatus for encoding a non-binary LDPC code in a communication system. The apparatus includes a first matrix multiplier for multiplying an information vector by a first partial matrix of a parity check matrix; a second matrix multiplier for multiplying the information vector by a second partial matrix of the parity check matrix; a third matrix multiplier for multiplying a signal output from the first matrix multiplier by a matrix product of a sixth partial matrix and an inverse matrix of a fifth partial matrix of the parity check matrix; a first adder for adding a signal output from the second matrix multiplier and a signal output from the third matrix multiplier; a fourth matrix multiplier for multiplying a signal output from the first adder by a third partial matrix of the parity check matrix; a second adder for adding a signal output from the first matrix multiplier and a signal output from the fourth matrix multiplier; a fifth matrix multiplier for multiplying a signal output from the second adder by the inverse matrix of the fifth partial matrix of the parity check matrix; and assembler for multiplexing the information vector, the output signal of the first adder as a first parity vector, and the output signal of fifth matrix multiplier as a second parity vector, according to a format of the non-binary LDPC code, where q is an order of the GF and p is an exponential numeral.

In accordance with still a further aspect of the present invention, there is provided a method for encoding a non-binary LDPC code in a communication system. The method includes generating a first signal by multiplying an information vector by a first partial matrix of a parity check matrix; generating a second signal by multiplying the information vector by a second partial matrix of the parity check matrix; generating a third signal by multiplying the first signal by a matrix product of a sixth partial matrix and an inverse matrix of a fifth partial matrix of the parity check matrix; generating a fourth signal by adding the second signal and the third signal; generating a fifth signal by multiplying the fourth signal by a third partial matrix of the parity check matrix; generating a sixth signal by adding the first signal and the fifth signal; generating a seventh signal by multiplying the sixth signal by the inverse matrix of the fifth partial matrix of the parity check matrix; and assembling the information vector, the fourth signal as a first parity vector, and the seventh signal as a second parity vector, according to a format of the non-binary LDPC code, where q is an order of the GF and p is an exponential numeral.

BRIEF DESCRIPTION OF THE DRAWINGS

The above and other objects, features and advantages of the present invention will be more apparent from the following detailed description taken in conjunction with the accompanying drawings, in which:

FIG. 3 is a diagram of a non-binary essential matrix according to the present invention;

FIG. 4 is a diagram of a parity check matrix having a form of a full lower triangular matrix according to of the present invention;

FIG. 6 is a diagram of a parity check matrix when a non-binary cyclic matrix Q is applied to the parity check matrix illustrated in FIG. 4.

FIG. 8A is a diagram of a transpose matrix of the matrix B, the matrix E, the matrix D, the matrix T shown in FIG. 7;

FIG. 8B is a diagram of an inverse matrix of the matrix T shown in FIG. 7;

DETAILED DESCRIPTION OF THE PREFERRED EMBODIMENTS

Figure 1:
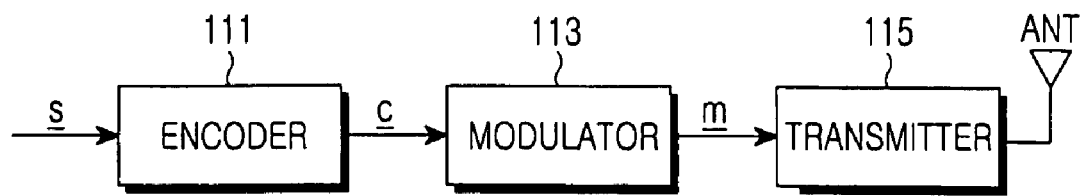
FIG. 1 is a block diagram of a signal transmission apparatus in a common communication system using a non-binary LDPC code.

Preferred embodiments of the present invention will now be described with reference to the accompanying drawings. It should be noted that the similar components are designated by similar reference numerals although they are illustrated in different drawings. Also, in the following description, a description of known functions and configurations incorporated herein will be omitted when it may obscure the subject matter of the present invention. Further, it should be noted that only parts essential for understanding the operations according to the present invention will be described and a description of parts other than the essential parts will be omitted in order not to obscure the gist of the present invention.

Figure 2:
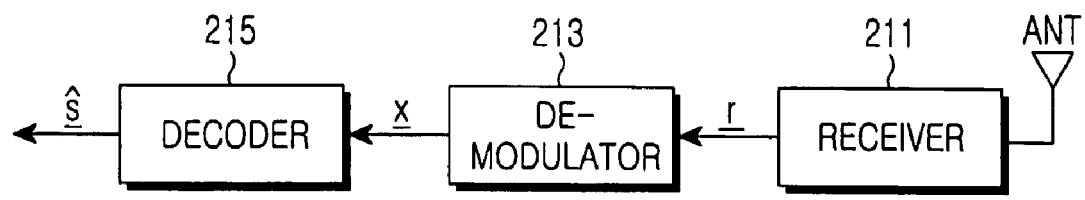
FIG. 2 is a block diagram of a signal reception apparatus in a common communication system using a non-binary LDPC code.

The present invention provides an apparatus and a method for receiving signal in a communication system using a non-binary Low Density Parity Check (LDPC) code. Further, although separately described and illustrated herein, it is clear that operation of transmitting/receiving signal using the non-binary LDPC code of the present invention can be applied to the signal transmission apparatus shown in FIG. 1 and the signal reception apparatus shown in FIG. 2.

In the present invention, a scheme based on a Richardson-Urbanke encoding scheme will be used as an encoding scheme for a non-binary LDPC code. In the present invention, a parity check matrix includes a plurality of sub-matrixes. Each of the plurality of sub-matrixes is a square matrix of size $Z_f \times Z_f$. A zero matrix or a non-binary essential matrix is arranged in each of the plurality of sub-matrixes. The non-binary essential matrix is generated by multiplying a vector including an element on a Galois Field $(GF)(q=2^p)$ or an element with a permutation matrix. As previously described, q is an order of the GF, and $q=2^p$. Each of the rows constituting a essential matrix has a weight of 1 and each of the columns constituting a essential matrix also has a weight of 1. The weight represents the number of a non-zero element.

Reference will now be made to a non-binary essential matrix, with reference to FIG. 3.

In FIG. 3, $\pi$ represents a non-binary essential matrix, and each of a,b,c,d,e represents a non-zero element on $GF(q=2^p)$.

As described above, in the present invention, a scheme based on a Richardson-Urbanke encoding scheme will be used as an encoding scheme for a non-binary LDPC code. Because the scheme based on a Richardson-Urbanke encoding scheme will be used as an encoding scheme for a non-binary LDPC code, an encoding complexity is minimized when a form of a parity check matrix is similar to a full lower triangular matrix. If a length of a non-binary LDPC code with a parity check matrix as a full lower triangular matrix is N, encoding complexity of a non-binary LDPC code linearly increases with respect to a length N (0(N)).

The biggest problem of the non-binary LDPC code having the parity check matrix as the full lower triangular matrix is that if a length of a sub-matrix is defined as $Z_f$, $Z_f$ parity nodes whose degrees are always 1 in a bipartite graph of the non-binary LDPC code are generated. The parity nodes with a degree of 1 cannot affect the performance improvement based on an iterative decoding. Therefore, a standard irregular non-binary LDPC code does not include a parity node with a degree of 1.

So, in the present invention, a parity check matrix of FIG. 4 will be assumed as a basic parity check matrix in order to design a parity check matrix such that it enables efficient encoding while not including a parity node with a degree of 1.

Referring to FIG. 4, a parity check matrix includes an information part and parity part. The information part represents a part of the parity check matrix, mapped to an information vector $\underline{s}$, and the parity part represents a part of the parity check matrix, mapped to a parity vector $\underline{P}$. The parity vector $\underline{P}$ includes a first parity vector $\underline{P}_1$ and a second parity vector $\underline{P}_2$. The parity check matrix shown in FIG. 4 is different from a parity check matrix having a form of a full lower triangular matrix in a form of a parity part. In FIG. 4, a suffix m of a non-binary essential matrix on the information part represents a number of rows of a sub-matrix included in the parity check matrix, and a suffix n of a non-binary essential matrix on the information part represents a number of columns of a sub-matrix included in the parity check matrix. Also, as shown in FIG. 4, the non-binary essential matrixes are arranged in the parity check matrix such that a weight of the information part is irregular.

In the present invention, for example, it is assumed that the non-binary essential matrix $\pi$ is a non-binary cyclic matrix. The non-binary cyclic matrix can be expressed as Equation (1).

$$Q = \alpha^j \cdot P^i, 0 \leq j \leq q-2, 1 \leq i \leq Z_f \qquad (1)$$

In Equation (1), Q represents a non-binary cyclic matrix, $\alpha$ is a primitive element on $GF(q=2^p)$, and $P^i$ is a permutation matrix. The permutation matrix $P^i$ is generated by cyclic-shifting a location of a value of 1 of each of the rows on an identity matrix by an i unit in a right direction.

The permutation matrix $P^i$ will be described with reference to FIG. 5.

Figure 5:
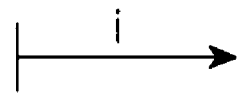
FIG. 5 is a diagram of a permutation matrix $P^i$.

In FIG. 5, a permutation matrix $P^1$ is generated by cyclic-shifting a location of a value of 1 of each of rows on an identity matrix by an 1 unit in a right direction, and the permutation matrix $P^i$ is generated by cyclic-shifting a location of a value of 1 of each of the rows on an identity matrix by an i unit in a right direction.

Next, a parity check matrix, when the non-binary cyclic matrix Q is applied to the parity check matrix, as shown in FIG. 4, will be described with reference to FIG. 6.

In FIG. 6, a size of the parity check matrix is determined based on a length and a coding rate of the non-binary LDPC code. If the length is N, and the coding rate is R, a size of the parity check matrix is N(1−R)×N when all rows of the parity check matrix are independent of one another. The parity check matrix shown in FIG. 6 includes m×n sub-matrixes. m represents the number of row of the sub-matrix included in the parity check matrix, and n represents the number of column of the sub-matrix included in the parity check matrix. Because a size of the sub-matrix is $Z_f \times Z_f$, the parity check matrix includes $Z_f \times m$ rows and $Z_f \times n$ columns.

In the parity check matrix of FIG. 6 comprised of the sub-matrixes, the selection of a sub-matrix is a very important factor for a performance improvement of the non-binary LDPC code, so that finding an appropriate selection criterion for the sub-matrix also becomes a very important factor.

A description will now be made of a method for generating a parity check matrix of a non-binary LDPC code based on the foregoing non-binary LDPC code.

Figure 7:
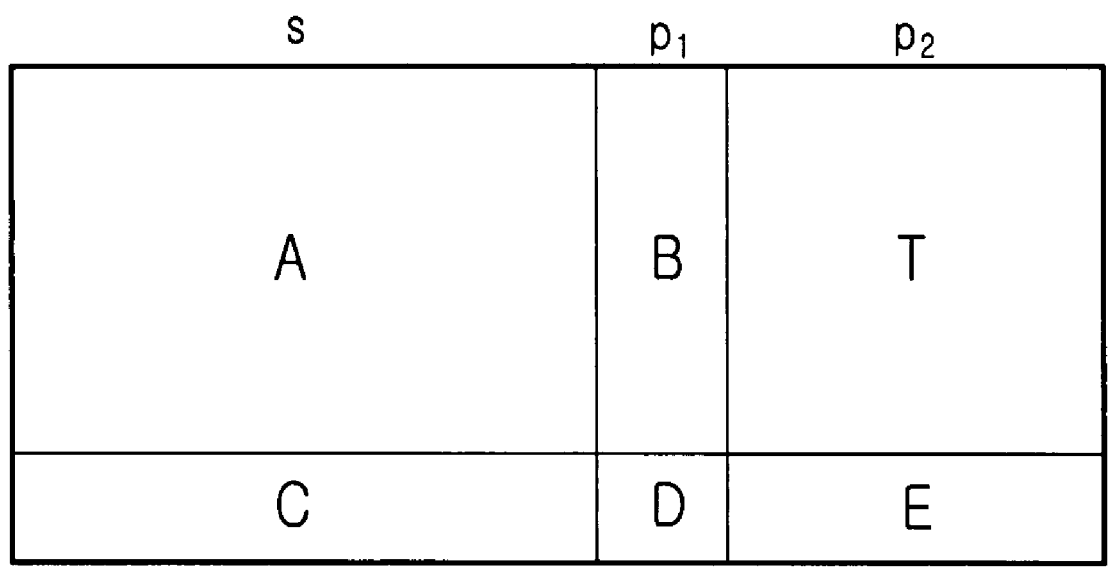
FIG. 7 is a diagram of the parity check matrix of FIG. 6 which is divided into 6 partial blocks.

In order to facilitate a method of generating a parity check matrix of the non-binary LDPC code and a method for encoding the non-binary LDPC code, the parity check matrix shown in FIG. 6 is assumed to be formed with 6 blocks, as shown in FIG. 7.

In FIG. 7, a parity check matrix of the non-binary LDPC code shown in FIG. 6 is divided into an information part 's', a first parity part $p_1$, and a second parity part $p_2$. The information part 's' represents a part of the parity check matrix, mapped to an actual information vector S during the process of encoding a non-binary LDPC code. The first parity part $p_1$ represents a part of the parity check matrix, mapped to an actual first parity vector $P_1$ during the process of encoding a non-binary LDPC code, and the second parity part $p_2$ represents a part of the parity check matrix, mapped to an actual second parity vector $P_2$ during the process of encoding a non-binary LDPC code.

Matrixes A and C correspond to blocks A and C of the information part 's', matrixes B and D correspond to blocks B and D of the first parity part $p_1$, and matrixes T and E correspond to blocks T and E of the second parity part $p_2$. A process of simplifying a encoding method using the matrixes of the information part 's', the first parity part $p_1$ and the second parity part $p_2$ will be described later.

When the parity check matrix is divided into an information part s, a first parity part $p_1$ and a second parity part $p_2$, as shown in FIG. 7, a codeword vector c can be divided into an information word vector s, a first parity vector $\underline{p}_1$ and a second parity vector $\underline{p}_2$. In this case, a product of the parity check matrix and the codeword vector $\underline{c}$ can be expressed as Equation (2) and Equation (3).

$$A\underline{s}^T + B\underline{p}_1^T + T\underline{p}_2^T = 0 \quad (2)$$

$$(ET^{-1}A + C)\underline{s}^T + (ET^{-1}B + D)\underline{p}_1^T = 0 \quad (3)$$

In Equation (2), T denotes a transpose operation, and in Equation (3), a part $\underline{p}_1^T$ related to a first parity vector $\underline{p}_1$ can be calculated by $$\underline{p}_1^T = \phi^{-1}(ET^{-1}A+C)\underline{s}^T (\phi \triangleq ET^{-1}B+D) \quad (4)$$

In Equation (4), because the encoding complexity of the non-binary LDPC code is in proportion to the square of a size of a matrix $\phi$, the present invention sets the matrix $\phi$ used for calculating the first parity vector $\underline{p}_1$ as an identity matrix I. By setting the matrix $\phi$ as an identity matrix I in this way, the encoding complexity of the non-binary LDPC code is minimized. With reference to FIGS. 8A and 8B, a description will now be made of a process of setting the matrix $\phi$ as an identity matrix I.

In FIGS. 8A and 8B, a matrix $B^T$ represents a transpose matrix of the matrix B, and a matrix $T^{-1}$ represents an inverse matrix of the matrix T. The $P^{(i_1 \sim i_2)}$ represents $$\prod_{l=i_1}^{i_2} P^{i_1} = P^{\sum_{l=i_1}^{i_2} a_l}$$

as a product of a matrix $P^{i_1}$ to a matrix $P^{i_2}$.

Because a matrix E includes all zero matrixes except one sub-matrix, a product of the matrix E and an inverse matrix $T^{-1}$ of the matrix T can be expressed as a product of the last row of the inverse matrix $T^{-1}$ of the matrix T and the last sub-matrix of the matrix E, as shown in Equation (5).

$$ET^{-1} = \alpha^{j_m} P^{i_m} \begin{bmatrix} \alpha^{-\sum_{l=1}^{m-1} k_l + \sum_{y=2}^{m-1} j_y} P^{i_2 \sim i_{m-1}} \vdots \cdots \vdots \\ \alpha^{-\sum_{l=w}^{m-1} k_l + \sum_{r=w+1}^{m-1} j_r} P^{i_{w+1} \sim i_{m-1}} \vdots \cdots \vdots \alpha^{-k_{m-1}} I \end{bmatrix} \quad (5)$$

If the product of the matrix E and an inverse matrix $T^{-1}$ of the matrix T is multiplied by the matrix B, the result can be expressed as shown in Equation (6).

$$ET^{-1}B = \alpha^{-\sum_{l=1}^{m-1} k_l + \sum_{y=1}^{m} j_y} P^{\sum_{y=1}^{m} i_y} + \alpha^{j_y - \sum_{l=1}^{m-1} k_l + \sum_{y=w+1}^{m} j_r} P^{i_y + \sum_{r=w+1}^{m} i_r} \quad (6)$$

In Equation (6), W is an arbitrary natural number determined corresponding to a location of $\alpha^{j_y} P^{i_y}$.

When the product of the matrix E and an inverse matrix $T^{-1}$ of the matrix T is multiplied by the matrix B, as shown in Equation (6), because the matrix B includes all zero matrixes except two sub-matrixes, multiplication is performed on only the two sub-matrixes in the matrix B, thereby simplifying calculation.

If $$D = \alpha^{j_x} P^{i_x} = \alpha^{-\sum_{l=1}^{m-1} k_l + \sum_{y=1}^{m} j_y} P^{\sum_{y=1}^{m} i_y} \text{ and}$$

$$\alpha^{j_y - \sum_{l=1}^{m-1} k_l + \sum_{y=w+1}^{m} j_y} P^{i_y + \sum_{y=w+1}^{m} i_y} = I,$$

then $\phi \approx ET^{-1}B + D = I$.

Therefore, the matrix $\phi$ becomes an identity matrix I. Equation (7) below briefly expresses the conditions that the matrix $\phi$ becomes an identity matrix I.

$$j_x \equiv -\sum_{l=1}^{m-1} k_l + \sum_{r=1}^{m} j_r (\bmod q - 1) \quad (7)$$

$$i_x \equiv \sum_{r=1}^{m} i_r (\bmod Z_f)$$

$$j_y - \sum_{l=w}^{m-1} k_l + \sum_{r=w+1}^{m} j_r \equiv 0 (\bmod q - 1)$$

$$i_y + \sum_{r=w+1}^{m} i_r \equiv 0 (\bmod Z_f)$$

As described with reference to Equation (7), if the matrix φ is set as an identity matrix I, an encoding process for the non-binary LDPC code can be simplified in its complexity.

Also, if $$D \triangleq \alpha^{j_x} P^{i_x} = \alpha^{j_y - \sum_{l=1}^{m-1} k_l + \sum_{y=w+1}^{m} j_y} P^{i_y + \sum_{y=w+1}^{m} i_y} \text{ and}$$

$$\alpha^{-\sum_{l=1}^{m-1} k_l + \sum_{y=1}^{m} j_y} P^{\sum_{y=1}^{m} i_y} = I, \text{ then } \phi \approx ET^{-1}B + D = I.$$

Therefore, the matrix φ becomes an identity matrix I. Equation (8) below briefly expresses the conditions that the matrix φ becomes an identity matrix I.

$$j_x \equiv j_y - \sum_{l=1}^{m-1} k_l + \sum_{r=1}^{m} j_r (\text{mod } q - 1) \quad (8)$$

$$i_x \equiv i_y + \sum_{r=1}^{m} i_r (\text{mod} Z_f)$$

$$\sum_{r=w+1}^{m} j_r - \sum_{l=w}^{m-1} k_l \equiv 0 (\text{mod } q - 1)$$

$$\sum_{r=w+1}^{m} i_r \equiv 0 (\text{mod} Z_f)$$

As described with reference to Equation (8), if the matrix φ is set as an identity matrix I, an encoding process for the non-binary LDPC code can be simplified in its complexity.

IF $i_2 = i_3 = \ldots = i_{m-1} = 0$, Equation (7) and Equation (8) will be more simplified, and $i_x$, $i_y$ in Equation (7) and Equation (8) can be simplified as shown in Equation (9) and Equation (10).

$$i_x \equiv i_1 + i_m (\text{mod} Z_f), i_m + i_y \equiv 0 (\text{mod} Z_f) \quad (9)$$

$$i_x \equiv i_y + i_m (\text{mod} Z_f), i_m + i_1 \equiv 0 (\text{mod} Z_f) \quad (10)$$

If condition as $i_m = 0$ is applied to Equation (9) and Equation (10), Equation (9) and Equation (10) can be simplified as shown in Equation (11) and Equation (12).

$$i_x \equiv i_1 (\text{mod} Z_f), i_y \equiv 0 (\text{mod} Z_f) \quad (11)$$

$$i_1 \equiv 0 (\text{mod} Z_f), i_y \equiv i_x (\text{mod} Z_f) \quad (12)$$

By appropriately selecting the sub-matrixes of the entire parity check matrix as described above, the matrix multiplication for $ET^{-1}$ is relatively simplified, thereby facilitating the calculation for $ET^{-1}As^T$. In addition, the matrix φ becomes an identity matrix I, so that a calculation process for $\phi^{-1}$ for calculating $P_1^T$ is omitted.

Next, a process of encoding a non-binary LDPC code according to the present invention will be described with reference to FIG. 9.

Figure 9:
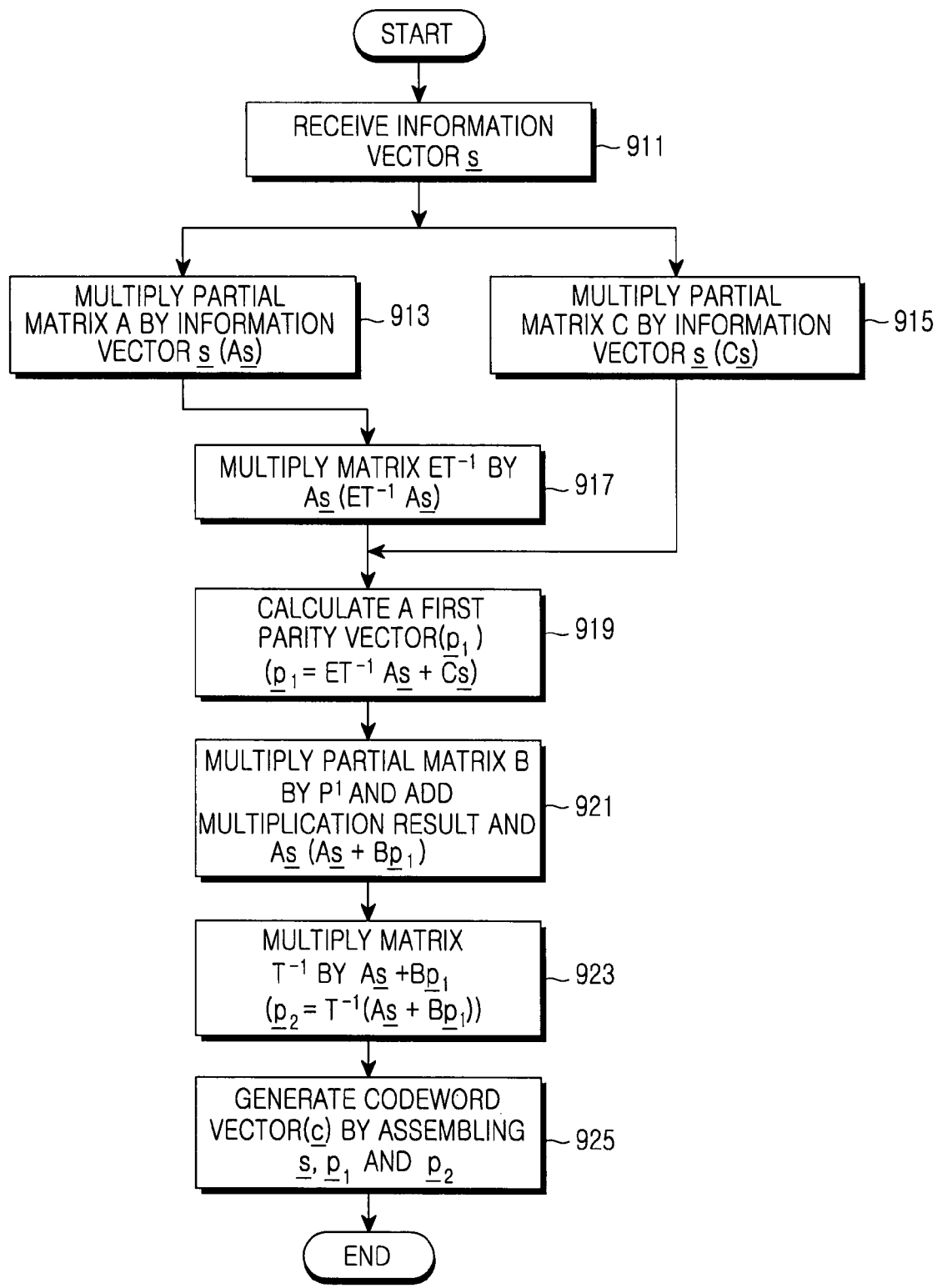
FIG. 9 is a flowchart illustrating a process of encoding a non-binary LDPC code according to the present invention.

In FIG. 9, in step 911, an encoder receives an information vector 's' to be encoded into the non-binary LDPC code, and then proceeds to steps 913 and 915. In step 913, the encoder matrix-multiplies the received information vector 's' by a matrix A of the parity check matrix (As), and then proceeds to step 917. Because the number of elements having a non-zero value located in the matrix A is much less than the number of elements having a value of 0, the matrix multiplication (As) of the information vector s and the matrix A of the parity check matrix can be achieved with a relatively small number of sum-product operations. In addition, in the matrix A, because a position where elements having a non-zero value are located can be expressed as an exponential multiplication of a position of a non-zero sub-matrix and a permutation matrix of the sub-matrix, the matrix multiplication can be performed with a very simple operation as compared with a random parity check matrix. In step 915, the encoder performs matrix multiplication (Cs) on a matrix C of the parity check matrix and the information vector 's', and then proceeds to step 919.

In step 917, the encoder performs matrix multiplication ($ET^{-1}As$) on the matrix multiplication result (As) of the information vector 's' and the matrix A of the parity check matrix, and a matrix $ET^{-1}$, and then proceeds to step 919. Because the number of elements having non-zero value in the matrix $ET^{-1}$ is very small as described above, if an exponent of a non-binary essential matrix as a sub-matrix is given, the matrix multiplication can be simply performed. In step 919, the encoder calculates a first parity vector $p_1$ by adding the $ET^{-1}As$ and the Cs ($p_1 = ET^{-1}As + Cs$), and then proceeds to step 921. The addition operation is an addition operation on GF(q). That is, the process up to step 919 is a process for calculating the first parity vector $p_1$.

In step 921, the encoder multiplies a matrix B of the parity check matrix by the first parity vector $p_1$ (B $p_1$), adds the multiplication result ($Bp_1$) to the As ($As+Bp_1$), and then proceeds to step 923. If the information vector 's' and the first parity vector $p_1$ are given, they should be multiplied by an inverse matrix $T^{-1}$ of a matrix T of the parity check matrix to calculate a second parity vector $p_2$. Therefore, in step 923, the encoder multiplies the calculation result ($As+Bp_1$) of step 921 by the inverse matrix $T^{-1}$ of the matrix T to calculate the second parity vector $p_2$ ($p_2 = T^{-1}(As+Bp_1)$), and then proceeds to step 925. As described above, if the information vector 's' of a non-binary LDPC code to be coded is given, the first parity vector $p_1$ and the second parity vector $p_2$ can be calculated, and as a result, all codeword vectors can be obtained. In step 925, the encoder generates a codeword vector 'c' using the information vector 's', the first parity vector $p_1$ and the second parity vector $p_2$, and transmits the generated codeword vector 'c'.

Next, with reference to FIG. 10, a description will be made of an apparatus for encoding a non-binary LDPC code according to the present invention.

Figure 10:
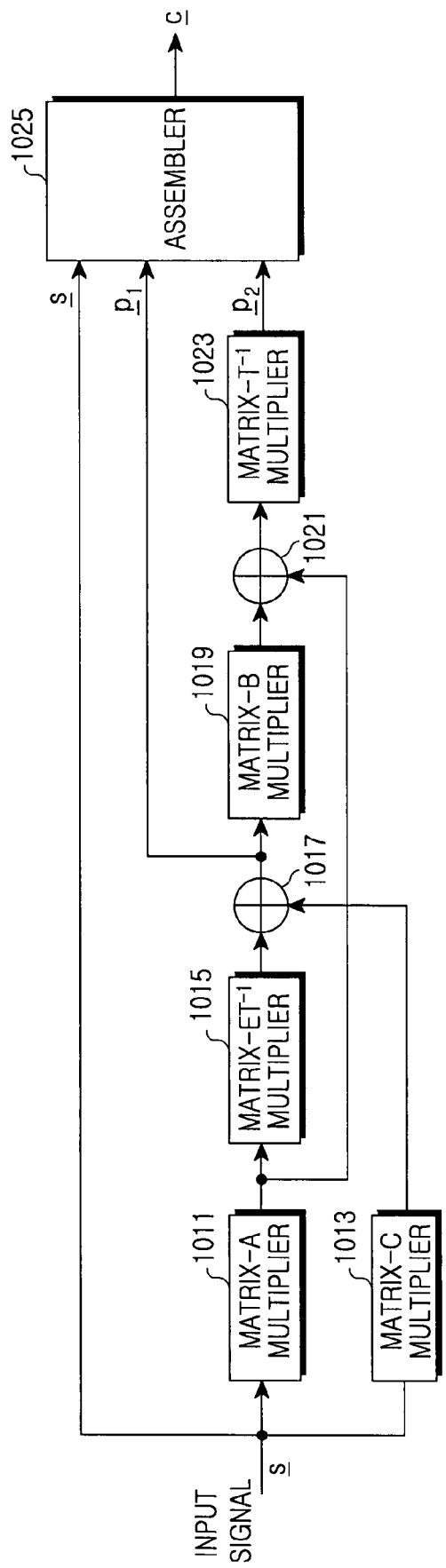
FIG. 10 is a block diagram of an apparatus for encoding a non-binary LDPC code according to the present invention.

In FIG. 10, an apparatus for encoding a non-binary LDPC code includes a matrix-A multiplier 1011, matrix-C multiplier 1013, a matrix-$ET^{-1}$ multiplier 1015, an adder 1017, a matrix-B multiplier 1019, an adder 1021, a matrix $T^{-1}$ multiplier 1023, and an assembler 1025.

If an input signal, i.e. an information vector 's' to be encoded into a non-binary LDPC code, is received, the received information vector 's' is input to the assembler 1025, the matrix-A multiplier 1011 and the matrix-C multiplier 1013. The matrix-A multiplier 1011 multiplies the information vector 's' by a matrix A of the full parity check matrix, and outputs the multiplication result to the matrix-$ET^{-1}$ multiplier 1015 and the adder 1021. The matrix-C multiplier 1013 multiplies the information vector 's' by a matrix C of the full parity check matrix, and outputs the multiplication result to the adder 1017. The matrix-$ET^{-1}$ multiplier 1015 multiplies the signal output from the matrix-A multiplier 1611 by a matrix $ET^{-1}$ of the full parity check matrix, and outputs the multiplication result to the adder 1017.

The adder 1017 adds the signal output from the matrix-$Et^{-1}$ calculator 1015 to the signal output from the matrix-C multiplier 1013, and outputs the addition result to the matrix-B multiplier 1019 and the assembler 1025. The adder 1017 performs the addition operation on GF(q). The signal output from the adder 1017 becomes a first parity vector $p_1$.

The matrix-B multiplier 1019 multiplies the signal output from the adder 1017, i.e. the first parity vector p by a matrix B of the full parity check matrix, and outputs the multiplication result to the adder 1021. The adder 1021 adds the signal output from the matrix-B multiplier 1019 to the signal output from the matrix-A multiplier 1011, and outputs the addition result to the matrix-$T^{-1}$ multiplier 1023. The adder 1021, like the adder 1017, performs the addition operation on GF(q) on the signal output from the matrix-B multiplier 1019 and the signal output from the matrix-A multiplier 1011, and outputs the addition operation on GF(q) result to the matrix-$T^{-1}$ multiplier 1023.

The matrix-$T^{-1}$ multiplier 1023 multiplies the signal output from the adder 1021 by an inverse matrix $T^{-1}$ of a matrix T of the full parity check matrix, and outputs the multiplication result to the assembler 1025. The output of the matrix-$T^{-1}$ multiplier 1023 becomes a second parity vector $p_2$.

The assembler 1025 generates a non-binary LDPC code as codeword vector c by assembling the information vector 's', the first parity vectors $\underline{p_1}$, and the second parity vector $\underline{p_2}$.

As can be appreciated from the foregoing description, the present invention provides a solution of encoding a non-binary LDPC code, minimizing encoding complexity of the non-binary LDPC code, thereby contributing to increase of efficiency on transmitting/receiving signal in a communication system using the non-binary LDPC code.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An apparatus for receiving signal in a communication system, the apparatus comprising:
   a receiver for receiving signal; and
   a decoder for generating an information vector by decoding the received signal using a parity check matrix of a non-binary low density parity check (LDPC) code,
   wherein the parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, non-binary essential matrixes are arranged in blocks from among the blocks classified as the first parity part, the non-binary essential matrixes are arranged in blocks from among the blocks classified as the second parity part in a lower triangular form block by block, and a non-binary essential matrix is generated by multiplexing an element on Galois Field (GF)($q=2^p$) with a permutation matrix, where q is an order of the GF and p is an exponential numeral.

2. The apparatus of claim 1, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block,
   wherein the non-binary essential matrixes are determined such that a matrix determined by adding a matrix product of a sixth partial matrix, an inverse matrix of a fifth partial matrix, and a third matrix, with a fourth partial matrix is an identity matrix,
   wherein the sixth partial matrix corresponds to the sixth partial block, the fifth partial matrix corresponds to the fifth partial block, the third partial matrix corresponds to the third partial block, and the fourth partial matrix corresponds to the fourth partial block.

3. The apparatus of claim 2, wherein non-binary essential matrixes are arranged in blocks including a diagonal from among the blocks classified as the fifth partial block, and blocks in lower blocks of the blocks including the diagonal,
   wherein the third partial block includes a first matrix, a second matrix, and zero matrixes, and the sixth partial block includes a third matrix and zero matrixes,
   wherein the first matrix is arranged in a first block from among blocks included in the third partial block, the second matrix is arranged in a block, except for the first block, from among blocks included in the third partial block,
   wherein the first matrix and the second matrix are non-binary essential matrixes,
   wherein the third matrix is arranged in a last block from among blocks included in the sixth partial block, and the third matrix is a non-binary essential matrix,
   wherein the fourth matrix is a non-binary essential matrix.

4. The apparatus of claim 3, wherein when the fourth matrix is a matrix D, the matrix D is $$D = \alpha^{j_x} P^{i_x} = \alpha^{-\sum_{l=1}^{m-1} k_l + \sum_{r=1}^{m} j_r} P^{\sum_{r=1}^{m} i_r},$$

$$\alpha^{j_y - \sum_{l=1}^{m-1} k_l + \sum_{r=w+1}^{m} j_r} P^{i_y + \sum_{r=w+1}^{m} i_r} = 1, \text{ and } i_x, j_x, i_y, j_y$$

are satisfied with $$j_x \equiv -\sum_{l=1}^{m-1} k_l + \sum_{r=1}^{m} j_r (\text{mod } q - 1)$$

$$i_x \equiv \sum_{r=1}^{m} i_r (\text{mod } Z_f)$$

$$j_y - \sum_{l=w}^{m-1} k_l + \sum_{r=w+1}^{m} j_r \equiv 0 (\text{mod } q - 1)$$

$$i_y + \sum_{r=w+1}^{m} i_r \equiv 0 (\text{mod } Z_f)$$

where, P is a permutation matrix, I is an identity matrix, mod represents modulo operation, W is an arbitrary natural number determined corresponding to a location of $\alpha^{j_y} P^{i_y}$, the $i_x, j_x, i_y, j_y$ represent cyclic-shift values when a permutation matrix is generated by cyclic-shifting a location of non-zero element on each row of an identity matrix in a specific direction, m is the number of the non-binary essential matrix included in the parity check matrix, $\alpha$ is a primitive element on GF($q=2^p$), and $Z_f$ is size a of the non-binary essential matrix.

5. The apparatus of claim 4, wherein when $i_2 = i_3 = \ldots = i_{m-1} = 0$, the $i_x, i_y$ are satisfied with $i_x = i_1 + i_m (\text{mod} Z_f), i_m + i_y \equiv 0 (\text{mod} Z_f)$ $i_x = i_y + i_m (\text{mod} Z_f), i_m + i_1 \equiv 0 (\text{mod} Z_f).$ 6. The apparatus of claim 5, wherein when $i_m = 0$, the $i_x, i_y$ are satisfied with $i_x = i_1 (\text{mod} Z_f), i_y \equiv 0 (\text{mod} Z_f)$ $i_1 \equiv 0 (\text{mod} Z_f), i_y \equiv i_x (\text{mod} Z_f).$ 7. The apparatus of claim 6, wherein when the fourth matrix is a matrix D, the matrix D is $$D \doteq \alpha^{j_x} P^{i_x} = \alpha^{j_y - \sum_{l=1}^{m-1} k_l + \sum_{r=w+1}^{m} j_r} P^{i_y + \sum_{r=w+1}^{m} i_r},$$

$$\alpha^{-\sum_{l=1}^{m-1} k_l + \sum_{r=1}^{m} j_r} P^{\sum_{r=1}^{m} i_r} = I, \text{ and } i_x, j_x, i_y, j_y$$

are satisfied with $$j_x \equiv j_y - \sum_{l=1}^{m-1} k_l + \sum_{r=1}^{m} j_r (\mod q - 1)$$

$$i_x \equiv i_y + \sum_{r=1}^{m} i_r (\mod Z_f)$$

$$\sum_{r=w+1}^{m} j_r - \sum_{l=w}^{m-1} k_l \equiv 0 (\mod q - 1)$$

$$\sum_{r=w+1}^{m} i_r \equiv 0 (\mod Z_f)$$

where, P is a permutation matrix, I is an identity matrix, mod represents modulo operation, W is an arbitrary natural number determined corresponding to a location of $\alpha^{j_y} P^{i_y}$, the $i_x, j_x, i_y, j_y$ represent cyclic-shift values when a permutation matrix is generated by cyclic-shifting a location of non-zero element on each row of an identity matrix in a specific direction, m is the number of the non-binary essential matrix included in the parity check matrix, $\alpha$ is a primitive element on GF($q=2^p$), and $Z_f$ is size a of the non-binary essential matrix.

8. The apparatus of claim 7, wherein when $i_2 = i_3 = \ldots = i_{m-1} = 0$, the $i_x, i_y$ are satisfied with $i_x \equiv i_1 + i_m (\mod Z_f), i_m + i_y \equiv 0 (\mod Z_f)$ $i_x \equiv i_y + i_m (\mod Z_f), i_m + i_1 \equiv 0 (\mod Z_f).$ 9. The apparatus of claim 8, wherein when $i_m = 0$, the $i_x, i_y$ are satisfied with $i_x \equiv i_1 (\mod Z_f), i_y \equiv 0 (\mod Z_f)$ $i_1 \equiv 0 (\mod Z_f), i_y \equiv i_x (\mod Z_f).$ 10. The apparatus of claim 1, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block,
wherein non-binary essential matrixes are arranged in two blocks from among the blocks corresponding to the third partial block, zero matrixes are arranged in blocks, except for the two blocks, from among the blocks corresponding to the third partial block, a non-binary essential matrix is arranged in a block from among the blocks corresponding to the fourth partial block, a non-binary essential matrix is arranged in one block from among the blocks corresponding to the sixth partial block, and zero matrixes are arranged in blocks, except for the one block, from among the blocks corresponding to the sixth partial block.

11. The apparatus of claim 1, wherein the non-binary essential matrixes are arranged in the blocks classified as the information part such that a weight of the information part is irregular.

12. The apparatus of claim 1, wherein if the blocks classified as the second parity part are classified into blocks corresponding to a first partial block and blocks corresponding to a second partial block, non-binary essential matrixes are arranged in blocks including a diagonal of the first partial block block by block.

13. The apparatus of claim 12, wherein non-binary essential matrixes are arranged in lower blocks of the blocks including the diagonal.

14. The apparatus of claim 13, wherein a non-binary essential matrix is arranged in a last block from among the blocks classified as the second partial block.

15. A method for receiving signal in a signal reception apparatus of a communication system, the method comprising:
receiving signal; and
generating an information vector by decoding the received signal using a parity check matrix of a non-binary low density parity check (LDPC) code,
wherein the parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, non-binary essential matrixes are arranged in blocks from among the blocks classified as the first parity part, the non-binary essential matrixes are arranged in blocks from among the blocks classified as the second parity part in a lower triangular form block by block, and a non-binary essential matrix is generated by multiplexing an element on Galois Field (GF)($q=2^p$) with a permutation matrix, where q is an order of the GF and p is an exponential numeral.

16. The method of claim 15, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block,
wherein the non-binary essential matrixes are determined such that a matrix determined by adding a matrix product of a sixth partial matrix, an inverse matrix of a fifth partial matrix, and a third matrix, with a fourth partial matrix is an identity matrix,
wherein the sixth partial matrix corresponds to the sixth partial block, the fifth partial matrix corresponds to the fifth partial block, the third partial matrix corresponds to the third partial block, and the fourth partial matrix corresponds to the fourth partial block.

17. The method of claim 16, wherein non-binary essential matrixes are arranged in blocks including a diagonal from among the blocks classified as the fifth partial block, and blocks in lower blocks of the blocks including the diagonal,
wherein the third partial block includes a first matrix, a second matrix, and zero matrixes, and the sixth partial block includes a third matrix and zero matrixes,
wherein the first matrix is arranged in a first block from among blocks included in the third partial block, the second matrix is arranged in a block, except for the first block, from among blocks included in the third partial block,
wherein the first matrix and the second matrix are non-binary essential matrixes,
wherein the third matrix is arranged in a last block from among blocks included in the sixth partial block, and the third matrix is a non-binary essential matrix,
wherein the fourth matrix is a non-binary essential matrix.

18. The method of claim 17, wherein when the fourth matrix is a matrix D, the matrix D is $$D = \alpha^{j_x} P^{i_x} = \alpha^{-\sum_{l=1}^{m-1} k_l + \sum_{r=1}^{m} j_r} P^{\sum_{r=1}^{m} i_r},$$

$$\alpha^{j_y - \sum_{l=1}^{m-1} k_l + \sum_{r=w+1}^{m} j_r} P^{i_y + \sum_{r=w+1}^{m} i_r} = 1, \text{ and } i_x, j_x, i_y, j_y$$

are satisfied with $$j_x \equiv -\sum_{l=1}^{m-1} k_l + \sum_{r=1}^{m} j_r (\text{mod } q - 1)$$

$$i_x \equiv \sum_{r=1}^{m} i_r (\text{mod } Z_f)$$

$$j_y - \sum_{l=w}^{m-1} k_l + \sum_{r=w+1}^{m} j_r \equiv 0 (\text{mod } q - 1)$$

$$i_y + \sum_{r=w+1}^{m} i_r \equiv 0 (\text{mod } Z_f)$$

where, P is a permutation matrix, I is an identity matrix, mod represents modulo operation, W is an arbitrary natural number determined corresponding to a location of $\alpha^{j_y} P^{i_y}$, the $i_x, j_x, i_y, j_y$ represent cyclic-shift values when a permutation matrix is generated by cyclic-shifting a location of non-zero element on each row of an identity matrix in a specific direction, m is the number of the non-binary essential matrix included in the parity check matrix, $\alpha$ is a primitive element on GF($q=2^p$), and $Z_f$ is size a of the non-binary essential matrix.

19. The method of claim 18, wherein when $i_2 = i_3 = \ldots = i_{m-1} = 0$, the $i_x, i_y$ are satisfied with $i_x \equiv i_1 + i_m (\text{mod} Z_f), i_m + i_y \equiv 0 (\text{mod} Z_f)$ $i_x \equiv i_y + i_m (\text{mod} Z_f), i_m + i_1 \equiv 0 (\text{mod} Z_f).$ 20. The method of claim 19, wherein when $i_m = 0$, the $i_x, i_y$ are satisfied with $i_x \equiv i_1 (\text{mod} Z_f), i_y \equiv 0 (\text{mod} Z_f)$ $i_1 \equiv 0 (\text{mod} Z_f), i_y \equiv i_x (\text{mod} Z_f).$ 21. The method of claim 20, wherein when the fourth matrix is a matrix D, the matrix D is $$D = \alpha^{j_x} P^{i_x} = \alpha^{j_y - \sum_{l=1}^{m-1} k_l + \sum_{r=w+1}^{m} j_r} P^{i_y + \sum_{r=w+1}^{m} i_r},$$

$$\alpha^{-\sum_{l=1}^{m-1} k_l + \sum_{r=1}^{m} j_r} P^{\sum_{r=1}^{m} i_r} = 1, \text{ and } i_x, j_x, i_y, j_y$$

are satisfied with $$j_x \equiv j_y - \sum_{l=1}^{m-1} k_l + \sum_{r=1}^{m} j_r (\text{mod } q - 1)$$

$$i_x \equiv i_y + \sum_{r=1}^{m} i_r (\text{mod } Z_f)$$

$$\sum_{r=w+1}^{m} j_r - \sum_{l=w}^{m-1} k_l \equiv 0 (\text{mod } q - 1)$$

$$\sum_{r=w+1}^{m} i_r \equiv 0 (\text{mod } Z_f)$$

where, P is a permutation matrix, I is an identity matrix, mod represents modulo operation, W is an arbitrary natural number determined corresponding to a location of $\alpha^{j_y} P^{i_y}$, the $i_x, j_x, i_y, j_y$ represent cyclic-shift values when a permutation matrix is generated by cyclic-shifting a location of non-zero element on each row of an identity matrix in a specific direction, m is the number of the non-binary essential matrix included in the parity check matrix, $\alpha$ is a primitive element on GF($q=2^p$), and $Z_f$ is size a of the non-binary essential matrix.

22. The method of claim 21, wherein when $i_2 = i_3 = \ldots = i_{m-1} = 0$ the $i_x, i_y$ are satisfied with $i_x \equiv i_1 + i_m (\text{mod} Z_f), i_m + i_y \equiv 0 (\text{mod} Z_f)$ $i_x \equiv i_y + i_m (\text{mod} Z_f), i_m + i_1 \equiv 0 (\text{mod} Z_f).$ 23. The method of claim 22, wherein when $i_m = 0$, the $i_x, i_y$ are satisfied with $i_x \equiv i_1 (\text{mod} Z_f), i_y \equiv 0 (\text{mod} Z_f)$ $i_1 \equiv 0 (\text{mod} Z_f), i_y \equiv i_x (\text{mod} Z_f).$ 24. The method of claim 15, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block,
wherein non-binary essential matrixes are arranged in two blocks from among the blocks corresponding to the third partial block, zero matrixes are arranged in blocks, except for the two blocks, from among the blocks corresponding to the third partial block, a non-binary essential matrix is arranged in a block from among the blocks corresponding to the fourth partial block, a non-binary essential matrix is arranged in one block from among the blocks corresponding to the sixth partial block, and zero matrixes are arranged in blocks, except for the one block, from among the blocks corresponding to the sixth partial block.

25. The method of claim 15, wherein the non-binary essential matrixes are arranged in the blocks classified as the information part such that a weight of the information part is irregular.

26. The method of claim 15, wherein if the blocks classified as the second parity part are classified into blocks corresponding to a first partial block and blocks corresponding to a second partial block, non-binary essential matrixes are arranged in blocks including a diagonal of the first partial block block by block.

27. The method of claim 26, wherein non-binary essential matrixes are arranged in lower blocks of the blocks including the diagonal.

28. The method of claim 27, wherein a non-binary essential matrix is arranged in a last block from among the blocks classified as the second partial block.

29. An apparatus for transmitting signal in a communication system, the apparatus comprising:
an encoder for generating a codeword vector by encoding an information vector using a parity check matrix of a non-binary low density parity check (LDPC) code; and
a transmitter for transmitting the codeword vector,
wherein the parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, non-binary essential matrixes are arranged in blocks from among the blocks classified as the first parity part, the non-binary essential matrixes are arranged in blocks from among the blocks classified as the second parity part in a lower triangular form block by block, and a non-binary essential matrix is generated by multiplexing an element on Galois Field (GF)($q=2^p$) with a permutation matrix, where q is an order of the GF and p is an exponential numeral.

30. The apparatus of claim 29, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block,
wherein the non-binary essential matrixes are determined such that a matrix determined by adding a matrix product of a sixth partial matrix, an inverse matrix of a fifth partial matrix, and a third matrix, with a fourth partial matrix is an identity matrix,
wherein the sixth partial matrix corresponds to the sixth partial block, the fifth partial matrix corresponds to the fifth partial block, the third partial matrix corresponds to the third partial block, and the fourth partial matrix corresponds to the fourth partial block.

31. The apparatus of claim 30, wherein non-binary essential matrixes are arranged in blocks including a diagonal from among the blocks classified as the fifth partial block, and blocks in lower blocks of the blocks including the diagonal,
wherein the third partial block includes a first matrix, a second matrix, and zero matrixes, and the sixth partial block includes a third matrix and zero matrixes,
wherein the first matrix is arranged in a first block from among blocks included in the third partial block, the second matrix is arranged in a block, except for the first block, from among blocks included in the third partial block,
wherein the first matrix and the second matrix are non-binary essential matrixes,
wherein the third matrix is arranged in a last block from among blocks included in the sixth partial block, and the third matrix is a non-binary essential matrix,
wherein the fourth matrix is a non-binary essential matrix.

32. The apparatus of claim 31, wherein when the fourth matrix is a matrix D, the matrix D is $$D = \alpha^{j_x} P^{i_x} = \alpha^{-\sum_{l=1}^{m-1} k_l + \sum_{r=1}^{m} j_r} P^{\sum_{r=1}^{m} i_r},$$

$$\alpha^{j_y - \sum_{l=1}^{m-1} k_l + \sum_{r=w+1}^{m} j_r} P^{i_y + \sum_{r=w+1}^{m} i_r} = 1, \text{ and } i_x, j_x, i_y, j_y$$

are satisfied with $$j_x \equiv -\sum_{l=1}^{m-1} k_l + \sum_{r=1}^{m} j_r (\mathrm{mod}\, q - 1)$$

$$i_x \equiv \sum_{r=1}^{m} i_r (\mathrm{mod}\, Z_f)$$

$$j_y - \sum_{l=w}^{m-1} k_l + \sum_{r=w+1}^{m} j_r \equiv 0 (\mathrm{mod}\, q - 1)$$

$$i_y + \sum_{r=w+1}^{m} i_r \equiv 0 (\mathrm{mod}\, Z_f)$$

where, P is a permutation matrix, I is an identity matrix, mod represents modulo operation, W is an arbitrary natural number determined corresponding to a location of $\alpha^{j_y} P^{i_y}$, the $i_x, j_x, i_y, j_y$ represent cyclic-shift values when a permutation matrix is generated by cyclic-shifting a location of non-zero element on each row of an identity matrix in a specific direction, m is the number of the non-binary essential matrix included in the parity check matrix, $\alpha$ is a primitive element on GF($q=2^p$), and $Z_f$ is size a of the non-binary essential matrix.

33. The apparatus of claim 32, wherein when $i_2 = i_3 = \ldots = i_{m-1} = 0$ the $i_x, i_y$ are satisfied with $$i_x \equiv i_1 + i_m (\mathrm{mod}\, Z_f), i_m + i_y \equiv 0 (\mathrm{mod}\, Z_f)$$

$$i_x \equiv i_y + i_m (\mathrm{mod}\, Z_f), i_m + i_1 \equiv 0 (\mathrm{mod}\, Z_f).$$

34. The apparatus of claim 33, wherein when $i_m = 0$, the $i_x, i_y$ are satisfied with $$i_x \equiv i_1 (\mathrm{mod}\, Z_f), i_y \equiv 0 (\mathrm{mod}\, Z_f)$$

$$i_1 \equiv 0 (\mathrm{mod}\, Z_f), i_y \equiv i_x (\mathrm{mod}\, Z_f).$$

35. The apparatus of claim 34, wherein when the fourth matrix is a matrix D, the matrix D is $$D = \alpha^{j_x} P^{i_x} = \alpha^{j_y - \sum_{l=1}^{m-1} k_l + \sum_{y=w+1}^{m} j_y} P^{i_y + \sum_{y=w+1}^{m} i_y},$$

$$\alpha^{-\sum_{l=1}^{m-1} k_l + \sum_{y=1}^{m} j_y} P^{\sum_{y=1}^{m} i_y} = I, \text{ and } i_x, j_x, i_y, j_y$$

are satisfied with $$j_x \equiv j_y - \sum_{l=1}^{m-1} k_l + \sum_{r=1}^{m} j_r (\mathrm{mod}\, q - 1)$$

$$i_x \equiv i_y + \sum_{r=1}^{m} i_r (\mathrm{mod}\, Z_f)$$

$$\sum_{r=w+1}^{m} j_r - \sum_{l=w}^{m-1} k_l \equiv 0 (\mathrm{mod}\, q - 1)$$

$$\sum_{r=w+1}^{m} i_r \equiv 0 (\mathrm{mod}\, Z_f)$$

where, P is a permutation matrix, I is an identity matrix, mod represents modulo operation, W is an arbitrary natural number determined corresponding to a location of $\alpha^{j_y}P^{i_y}$, the $i_x,j_x,i_y,j_y$ represent cyclic-shift values when a permutation matrix is generated by cyclic-shifting a location of non-zero element on each row of an identity matrix in a specific direction, m is the number of the non-binary essential-matrix included in the parity check matrix, $\alpha$ is a primitive element on GF($q=2^p$), and $Z_f$ is size a of the non-binary essential matrix.

36. The apparatus of claim 35, wherein when $i_2 = i_3 = \ldots = i_{m-1} = 0$ the $i_x,i_y$ are satisfied with $i_x \equiv i_1 + i_m (\bmod Z_f), i_m + i_y \equiv 0 (\bmod Z_f)$ $i_x \equiv i_y + i_m (\bmod Z_f), i_m + i_1 \equiv 0 (\bmod Z_f)$.

37. The apparatus of claim 36, wherein when $i_m = 0$, the $i_x,i_y$ are satisfied with $i_x \equiv i_1 (\bmod Z_f), i_y \equiv 0 (\bmod Z_f)$ $i_1 \equiv 0 (\bmod Z_f), i_y \equiv i_x (\bmod Z_f)$.

38. The apparatus of claim 29, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block,
wherein non-binary essential matrixes are arranged in two blocks from among the blocks corresponding to the third partial block, zero matrixes are arranged in blocks, except for the two blocks, from among the blocks corresponding to the third partial block, a non-binary essential matrix is arranged in a block from among the blocks corresponding to the fourth partial block, a non-binary essential matrix is arranged in one block from among the blocks corresponding to the sixth partial block, and zero matrixes are arranged in blocks, except for the one block, from among the blocks corresponding to the sixth partial block.

39. The apparatus of claim 29, wherein the non-binary essential matrixes are arranged in the blocks classified as the information part such that a weight of the information part is irregular.

40. The apparatus of claim 29, wherein if the blocks classified as the second parity part are classified into blocks corresponding to a first partial block and blocks corresponding to a second partial block, non-binary essential matrixes are arranged in blocks including a diagonal of the first partial block block by block.

41. The apparatus of claim 40, wherein non-binary essential matrixes are arranged in lower blocks of the blocks including the diagonal.

42. The apparatus of claim 41, wherein a non-binary essential matrix is arranged in a last block from among the blocks classified as the second partial block.

43. A method for transmitting signal in a signal transmission apparatus of a communication system, the method comprising:
generating a codeword vector by encoding an information vector using a parity check matrix of a non-binary low density parity check (LDPC) code; and
transmitting the codeword vector,
wherein the parity check matrix includes a plurality of blocks, the plurality of blocks are classified into blocks corresponding to an information part corresponding to the information vector, blocks corresponding to a first parity part corresponding to a first parity vector, and blocks corresponding to a second parity part corresponding to a second parity vector, non-binary essential matrixes are arranged in blocks from among the blocks classified as the first parity part, the non-binary essential matrixes are arranged in blocks from among the blocks classified as the second parity part in a lower triangular form block by block, and a non-binary essential matrix is generated by multiplexing an element on Galois Field (GF)($q=2^p$) with a permutation matrix, where q is an order of the GF and p is an exponential numeral.

44. The method of claim 43, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block,
wherein the non-binary essential matrixes are determined such that a matrix determined by adding a matrix product of a sixth partial matrix, an inverse matrix of a fifth partial matrix, and a third matrix, with a fourth partial matrix is an identity matrix,
wherein the sixth partial matrix corresponds to the sixth partial block, the fifth partial matrix corresponds to the fifth partial block, the third partial matrix corresponds to the third partial block, and the fourth partial matrix corresponds to the fourth partial block.

45. The method of claim 44, wherein non-binary essential matrixes are arranged in blocks including a diagonal from among the blocks classified as the fifth partial block, and blocks in lower blocks of the blocks including the diagonal,
wherein the third partial block includes a first matrix, a second matrix, and zero matrixes, and the sixth partial block includes a third matrix and zero matrixes,
wherein the first matrix is arranged in a first block from among blocks included in the third partial block, the second matrix is arranged in a block, except for the first block, from among blocks included in the third partial block,
wherein the first matrix and the second matrix are non-binary essential matrixes,
wherein the third matrix is arranged in a last block from among blocks included in the sixth partial block, and the third matrix is a non-binary essential matrix,
wherein the fourth matrix is a non-binary essential matrix.

46. The method of claim 45, wherein when the fourth matrix is a matrix D, the matrix D is $D = \alpha^{j_x} P^{i_x} = \alpha^{-\sum_{l=1}^{m-1} k_l + \sum_{y=1}^{m} j_y} P^{\sum_{y=1}^{m} i_y}$, $\alpha^{j_y - \sum_{l=1}^{m-1} k_l + \sum_{y=w+1}^{m} j_y} P^{j_y + \sum_{y=w+1}^{m} i_y} = 1$, and $i_x, j_x, i_y, j_y$ are satisfied with $$j_x \equiv -\sum_{l=1}^{m-1} k_l + \sum_{r=1}^{m} j_r (\bmod q - 1)$$

$$i_x \equiv \sum_{r=1}^{m} i_r (\bmod Z_f)$$

$$j_y - \sum_{l=w}^{m-1} k_l + \sum_{r=w+1}^{m} j_r \equiv 0 (\bmod q - 1)$$

$$i_y + \sum_{r=w+1}^{m} i_r \equiv 0 (\bmod Z_f)$$

where, P is a permutation matrix, I is an identity matrix, mod represents modulo operation, W is an arbitrary natural number determined corresponding to a location of $\alpha^{j_y} P^{i_y}$, the $i_x, j_x, i_y, j_y$ represent cyclic-shift values when a permutation matrix is generated by cyclic-shifting a location of non-zero element on each row of an identity matrix in a specific direction, m is the number of the non-binary essential matrix included in the parity check matrix, $\alpha$ is a primitive element on GF($q=2^p$), and $Z_f$ is size a of the non-binary essential matrix.

47. The method of claim 46, wherein when $i_2 = i_3 = \ldots = i_{m-1} = 0$ the $i_x, i_y$ are satisfied with $$i_x \equiv i_1 + i_m (\bmod Z_f), i_m + i_y \equiv 0 (\bmod Z_f)$$

$$i_x \equiv i_y + i_m (\bmod Z_f), i_m + i_1 \equiv 0 (\bmod Z_f).$$

48. The method of claim 47, wherein when $i_m = 0$, the $i_x, i_y$ are satisfied with $$i_x \equiv i_1 (\bmod Z_f), i_y \equiv 0 (\bmod Z_f)$$

$$i_1 \equiv 0 (\bmod Z_f), i_y \equiv i_x (\bmod Z_f).$$

49. The method of claim 45, wherein when the fourth matrix is a matrix D, the matrix D is $$D \doteq \alpha^{j_x} P^{i_x} = \alpha^{j_y - \sum_{l=1}^{m-1} k_l + \sum_{y=w+1}^{m} j_y} P^{i_y + \sum_{y=w+1}^{m} i_y},$$

$$\alpha^{-\sum_{l=1}^{m-1} k_l + \sum_{y=1}^{m} j_y} P^{\sum_{y=1}^{m} i_y} = I, \text{ and } i_x, j_x, i_y, j_y$$

are satisfied with $$j_x \equiv j_y - \sum_{l=1}^{m-1} k_l + \sum_{r=1}^{m} j_r (\bmod q - 1)$$

$$i_x \equiv i_y + \sum_{r=1}^{m} i_r (\bmod Z_f)$$

$$\sum_{r=w+1}^{m} j_r - \sum_{l=w}^{m-1} k_l \equiv 0 (\bmod q - 1)$$

$$\sum_{r=w+1}^{m} i_r \equiv 0 (\bmod Z_f)$$

where, P is a permutation matrix, I is an identity matrix, mod represents modulo operation, W is an arbitrary natural number determined corresponding to a location of $\alpha^{j_y} P^{i_y}$, the $i_x, j_x, i_y, j_y$ represent cyclic-shift values when a permutation matrix is generated by cyclic-shifting a location of non-zero element on each row of an identity matrix in a specific direction, m is the number of the non-binary essential matrix included in the parity check matrix, $\alpha$ is a primitive element on GF($q=2^p$), and $Z_f$ is size a of the non-binary essential matrix.

50. The method of claim 49, wherein when $i_2 = i_3 = \ldots = i_{m-1} = 0$, the $i_x, i_y$ are satisfied with $$i_x \equiv i_1 + i_m (\bmod Z_f), i_m + i_y \equiv 0 (\bmod Z_f)$$

$$i_x \equiv i_y + i_m (\bmod Z_f), i_m + i_1 \equiv 0 (\bmod Z_f).$$

51. The method of claim 50, wherein when $i_m = 0$, the $i_x, i_y$ are satisfied with $$i_x \equiv i_1 (\bmod Z_f), i_y \equiv 0 (\bmod Z_f)$$

$$i_1 \equiv 0 (\bmod Z_f), i_y \equiv i_x (\bmod Z_f).$$

52. The method of claim 43, wherein the blocks classified as the information part are classified into blocks corresponding to a first partial block and blocks corresponding to a second partial block, the blocks classified as the first parity part are classified into blocks corresponding to a third partial block and blocks corresponding to a fourth partial block, and the blocks classified as the second parity part are classified into blocks corresponding to a fifth partial block and blocks corresponding to a sixth partial block, wherein non-binary essential matrixes are arranged in two blocks from among the blocks corresponding to the third partial block, zero matrixes are arranged in blocks, except for the two blocks, from among the blocks corresponding to the third partial block, a non-binary essential matrix is arranged in a block from among-the blocks corresponding to the fourth partial block, a non-binary essential matrix is arranged in one block from among the blocks corresponding to the sixth partial block, and zero matrixes are arranged in blocks, except for the one block, from among the blocks, corresponding to the sixth partial block.

53. The method of claim 43, wherein the non-binary essential matrixes are arranged in the blocks classified as the information part such that a weight of the information part is irregular.

54. The method of claim 43, wherein if the blocks classified as the second parity part are classified into blocks corresponding to a first partial block and blocks corresponding to a second partial block, non-binary essential matrixes are arranged in blocks including a diagonal of the first partial block block by block.

55. The method of claim 54, wherein non-binary essential matrixes are arranged in lower blocks of the blocks including the diagonal.

56. The method of claim 55, wherein a non-binary essential matrix is arranged in a last block from among the blocks classified as the second partial block.

* * * * *